United States Patent [19]
Kamarehi et al.

[11] Patent Number: 5,498,308
[45] Date of Patent: Mar. 12, 1996

[54] PLASMA ASHER WITH MICROWAVE TRAP

[75] Inventors: Mohammad Kamarehi, No. Potomac; James E. Simpson, Gaithersburg, both of Md.

[73] Assignee: Fusion Systems Corp., Rockville, Md.

[21] Appl. No.: 202,187

[22] Filed: Feb. 25, 1994

[51] Int. Cl.$^6$ ........................................ H05H 1/00
[52] U.S. Cl. ............... 156/345; 315/39; 315/111.21; 216/69
[58] Field of Search ................................ 156/345, 643; 118/723 MW, 723 ME, 723 MR; 204/298.38; 315/111.21, 39

[56] References Cited

U.S. PATENT DOCUMENTS

| | | | |
|---|---|---|---|
| Re. 32,664 | 5/1988 | Osepchuk et al. | 219/742 |
| 3,584,177 | 6/1971 | Bucksbaum | 219/741 |
| 3,819,900 | 6/1974 | Ironfield | 219/750 |
| 3,872,349 | 3/1975 | Spero et al. | 315/39 |
| 3,882,352 | 5/1975 | Osepchuk et al. | 315/39.55 |
| 4,137,441 | 1/1979 | Bucksbaum | 219/742 |
| 4,137,442 | 1/1979 | Tateda . | |
| 4,207,452 | 6/1980 | Arai | 315/39 X |
| 4,511,779 | 4/1985 | Bucksbaum et al. | 219/732 |
| 4,776,923 | 10/1988 | Spencer et al. | 156/643 |
| 5,063,329 | 11/1991 | Okamoto | 315/111.21 |
| 5,082,517 | 1/1992 | Moslehi | 156/345 |
| 5,262,610 | 11/1993 | Huang et al. | 156/354 X |

FOREIGN PATENT DOCUMENTS

| | | |
|---|---|---|
| 0131433A3 | 1/1985 | European Pat. Off. . |
| 0196214A3 | 10/1986 | European Pat. Off. . |

OTHER PUBLICATIONS

"Characterization of a Novel Microwave Stripper", by F. Pasierb, A. Ghanbari, M. S. Ameen, and R. S. Heinrich, 8257a *Journal of Vacuum Science & Technology*, A 10(4), Jul./Aug. 1992, No. 4, Pt. 1, pp. 1096–1099.

Primary Examiner—Thi Dang
Attorney, Agent, or Firm—Pollock, Vande Sande & Priddy

[57] ABSTRACT

A plasma asher which obviates microwave leakage and attendant problems by providing a microwave trap proximate the opening through which the plasma tube exits the microwave cavity.

12 Claims, 5 Drawing Sheets

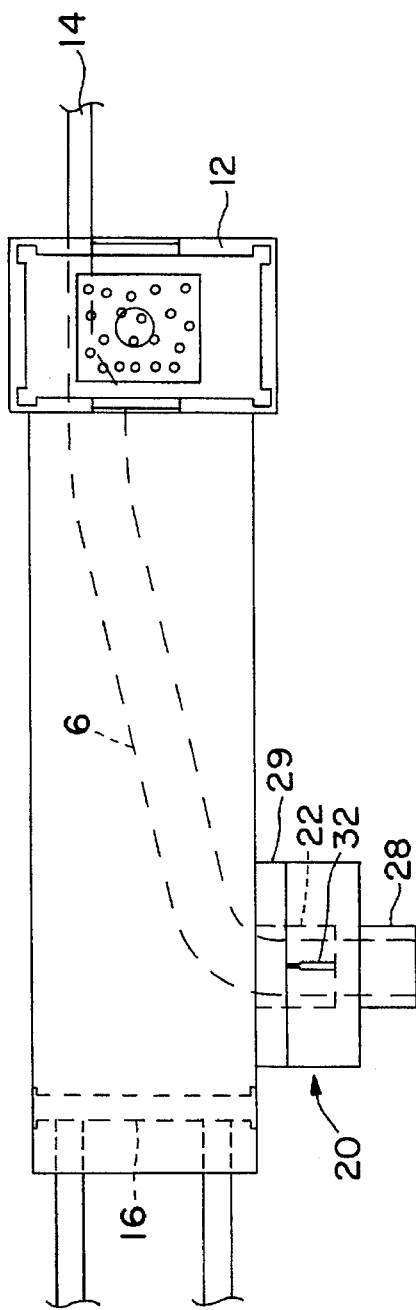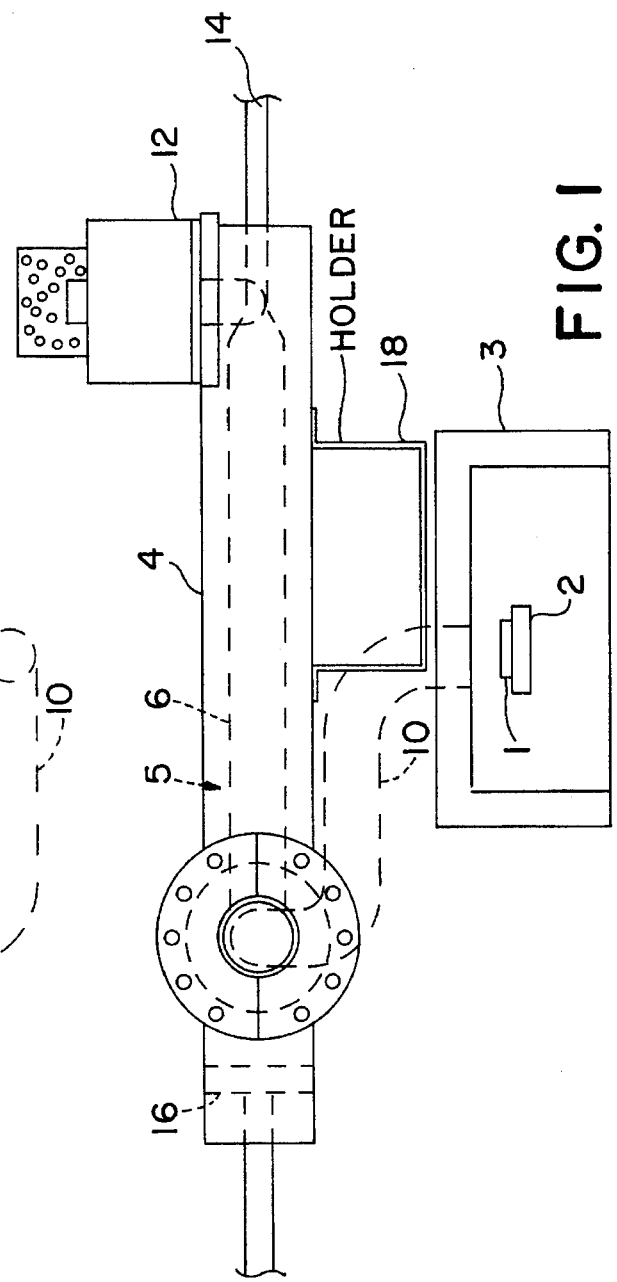

PLASMA ASHER WITH MICROWAVE TRAP

The present invention is directed to a plasma afterglow asher in which microwave leakage, and its resultant disadvantages are eliminated.

BACKGROUND OF THE INVENTION

In the manufacture of semiconductor devices, photoresists are used as masks, and after the masking function is completed, it is necessary to remove the photoresist from the semiconductor wafer. One type of device for stripping such photoresists is known as a plasma afterglow asher. In such a device, a gas such as oxygen which travels through a tube which runs through a microwave enclosure is exalted to a plasma state by microwave energy. The tube exits from the microwave enclosure through an opening, and travels to the region of the semiconductor wafer which is to be stripped. The idea of the device is to effect the stripping with excited atomic species which are present in the tube as extended out of the microwave enclosure (hence the name "afterglow"), rather than with the excited ionic species which are present within the part of the tube which is within the microwave enclosure, and in which the plasma is generated.

However, it has been found in prior art plasma afterglow ashers that microwave energy leaks out of the opening through which the plasma tube exits the microwave enclosure, causing multiple problems, as follows:

a) Energetic ions are produced in the vicinity of the wafer, which can cause wafer damage. The microwave leakage creates plasma in the part of the tube right outside the microwave enclosure, which plasma is a conductor, which causes further microwave leakage to extend further down the tube. This condition leads to ion acceleration by the electric fields which are now present closer to the wafer and produce energetic ions which cause wafer damage.

b) Due to electromagnetic interference with surrounding instruments, the microwave circuit becomes extremely unstable, thus reducing system reliability and limiting process capability.

c) High power applications are impeded by the microwave leakage, stray plasma, and the problems which are associated with system instability.

d) The ultraviolet radiation which is emitted by the stray plasma is also known to cause wafer damage.

SUMMARY OF THE INVENTION

In accordance with a first aspect of the present invention, the above problems are solved by providing a microwave trap exterior to the microwave enclosure proximate to the opening through which the plasma tube passes for trapping microwave energy which passes through the opening.

In accordance with a second aspect of the present invention, the microwave trap is such as to reduce the microwave current reaching the exit to zero.

In accordance with a further aspect of the invention, current flows in the shaped member which comprises the trap extending outwardly from the microwave enclosure, and is reduced to zero in a region between the microwave enclosure and the outer end of the trap.

In accordance with a still further aspect of the invention, an equivalent resonant circuit is created, which is effective to reduce the current in the device to zero.

In a preferred embodiment, the trap is comprised of coaxial inner and outer conductors, wherein the diameter of the outer conductor becomes smaller at a region displaced from the microwave enclosure and wherein the smaller diameter part of the outer conductor is spaced from the inner conductor by a gap.

The microwave trap is effective to eliminate microwave leakage, which has resulted in the following advantages:

a) Elimination of energetic ions near the photoresist, hence preventing wafer damage.

b) A tremendous increase in system stability and reliability also leading to an increase in process capability. Accordingly, with the use of the invention, the system can be operated through a wide range of operating parameters (i.e., pressure, flow rate, gas type, and power level).

c) The UV radiation has also been minimized.

BRIEF DESCRIPTION OF THE DRAWINGS

The invention will be better understood in connection with the accompanying drawings, wherein:

FIG. 1 is a schematic representation of the asher system in accordance with an embodiment of the invention.

FIG. 2 is a plan view of the embodiment of FIG. 1.

DESCRIPTION OF PREFERRED EMBODIMENTS

Figure 3:
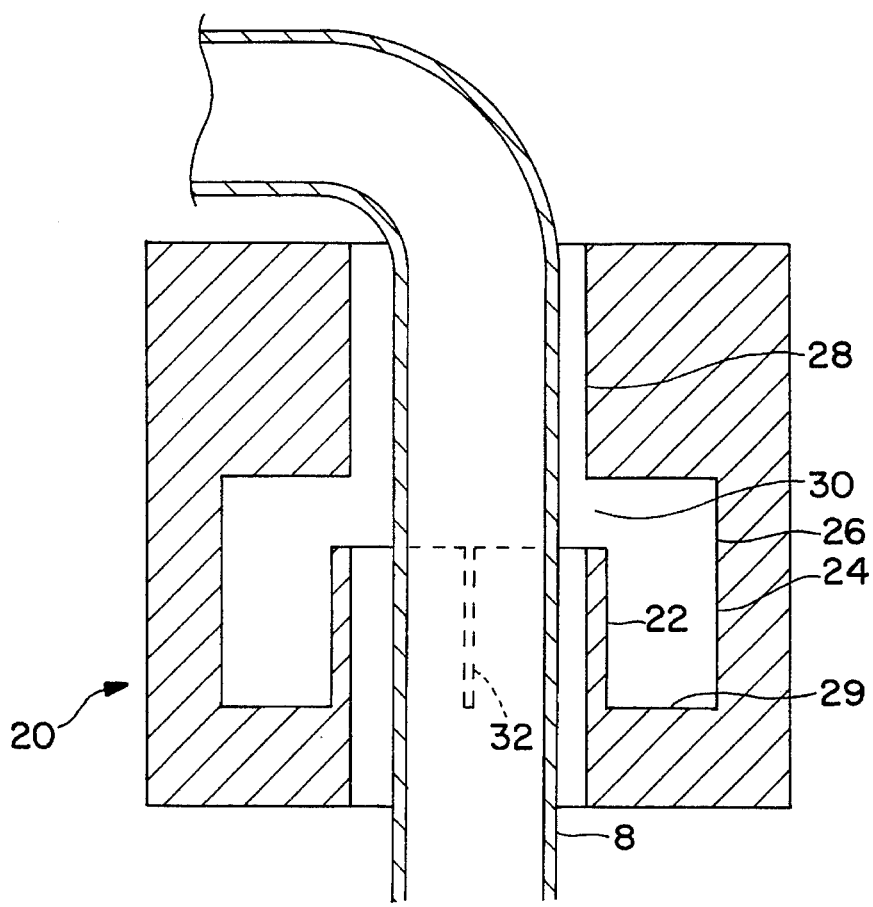
FIG. 3 is a cross-sectional view of a microwave trap in accordance with an embodiment of the invention.

Referring to FIGS. 1 and 2, a plasma asher device in accordance with an embodiment of the invention is depicted. Semiconductor wafer 1 has a photoresist on its top surface which is to be stripped. Wafer 1 sits on support 2 which is located in sealed vacuum process chamber 3.

Plasma tube 5, which is typically made of quartz is disposed in microwave enclosure 4, which is excited by magnetron 12. While the microwave enclosure may take a variety of specific forms, in accordance with the preferred embodiment of the present invention, it is a rectangular $TE_{102}$ cavity. The length of the cavity is adjusted with slidable short 16, so that tuning may be effected. Holder 18 is attached to microwave enclosure 4 for the purpose of fixing its position relative to the vacuum process chamber 3.

Referring again to FIGS. 1 and 2, it is seen that the plasma tube 5 comprises an end 14, a main portion 6 which is located in the microwave enclosure, a portion 8 which exits from the microwave enclosure, and a portion 10 which feeds down into the evacuated process chamber.

An excitable gas is fed into the end 14 of plasma tube 5. Typically, oxygen, which may be mixed with other gases such as $N_2H_2$ and $N_2O$, is used, but the invention is not limited to the use of any particular gas or gas mixture. A plasma is excited by the microwave energy in portion 6 of plasma tube 5, which plasma is comprised of energetic ions, and which radiates light of a color which is dependent on the particular gases which are present.

The plasma tube in the preferred embodiment has a diameter of about an inch, specifically 25 mm external diameter and 23 mm internal diameter. The tube therefore must pass through an opening in the microwave enclosure of at least about an inch in diameter, and from there passes down to the process chamber 3. Since the tube portions 8 and 10 are outside of the microwave enclosure, ideally there is no plasma (energetic ions) excited in these portions. Rather, what is desired is that there be excited or energetic atoms of oxygen (atomic oxygen or O), which is to be fed onto the photoresist to accomplish the required stripping.

In an actual device, it is found that the plasma is not confined to the part of the plasma tube which is in the microwave enclosure. It is believed that the reason for this is that microwave energy leaks out of the rather large opening which provides egress for the plasma tube.

This leakage microwave energy causes a number of serious problems to occur, as follows:

a) Energetic ions are produced in the vicinity of the wafer, which can cause wafer damage. The microwave leakage creates plasma in the part of the tube right outside the microwave enclosure, which plasma is a conductor, which causes further microwave leakage to extend further down the tube. This condition leads to ion acceleration by the electric fields which are now present closer to the wafer and produce energetic ions which cause wafer damage.

b) Due to electromagnetic interference with surrounding instruments, the microwave circuit becomes extremely unstable, thus reducing system reliability and limiting process capability.

c) High power applications are impeded by the microwave leakage, stray plasma, and the problems which are associated with system instability.

d) The ultraviolet radiation which is emitted by the stray plasma is also known to cause wafer damage.

In accordance with the present invention, a microwave trap is provided which obviates the above-mentioned problems.

Referring to FIG. 3, an embodiment of such a microwave trap is depicted by reference number 20. The trap is a coaxial device, and has inner and outer cylindrical conductors 22 and 24, respectively, through which plasma tube 8 passes. It is noted that there is a gap 30 between inner conductor 22 and portion 28 of the outer conductor. Portion 29 abuts the side of microwave enclosure 4.

Figure 4:
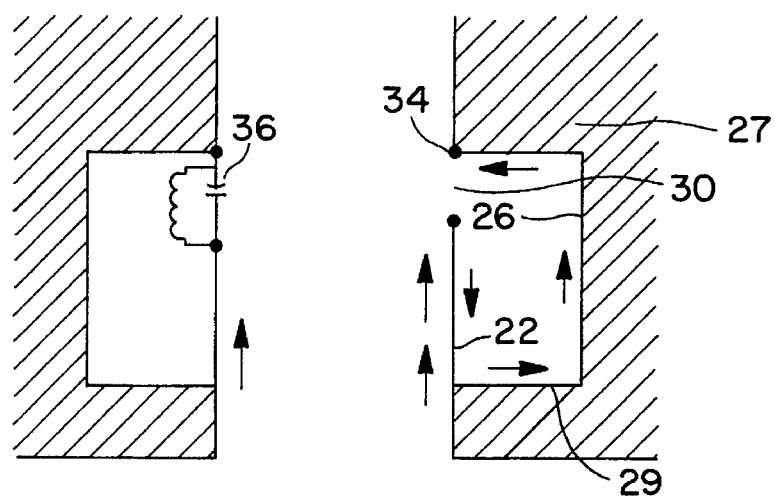
FIG. 4 shows an equivalent distributed circuit for the device of FIG. 3.

Microwave trap 20 is effective to reduce the microwave current to zero in the trap, thus indicating that there is no microwave field. Referring to FIG. 4, the current path in the device is depicted, and an equivalent distributed circuit is represented. It is seen that the current begins on the inside of the inner conductor 22, turns around the top of the inner conductor, and travels down the outside of the inner conductor. It then travels across part 29 and up the inside of outer conductor portion 26. It travels across outer conductor part 27, and then stops, that is, falls to zero at point 34. Thus, there is no current in portion 28 of the outer conductor.

The equivalent distributed circuit of the device is shown at reference number 36, and is depicted as a parallel LC circuit. The inductance L results from the impedance of the short circuited coaxial line (by Part 29), while the capacitance C is the capacitance across the gap or open circuit 30. In order to cause the current at point 34 to fall to zero, the dimensions of the device are adjusted so that the LC circuit is resonant. It is noted that the long dimension of the outer conductor is about ¼ wavelength. Also, it is noted that the inner conductor contains four lengthwise slits 32 which are located 90° apart, the purpose of which is to interrupt circumferentially directed currents which may tend to flow on the inner conductor.

Figure 5:
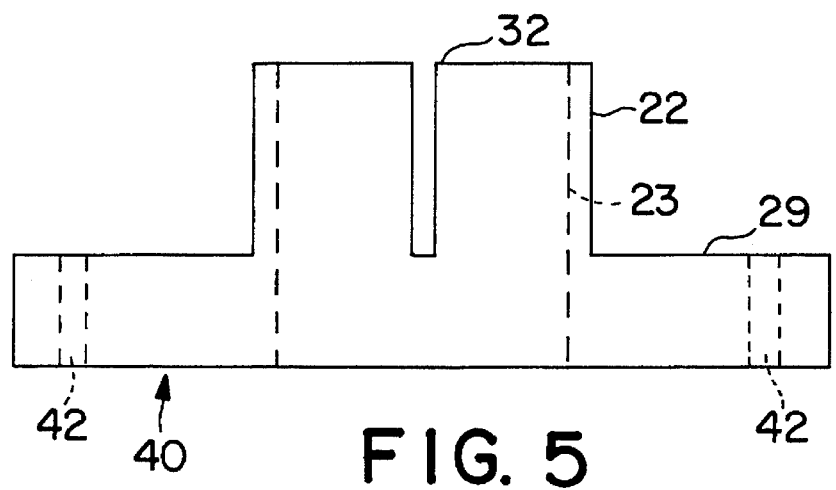
FIGS. 5 and 6 show the part that forms the inner conductor of the coaxial device shown in FIG. 3.
Figure 6:
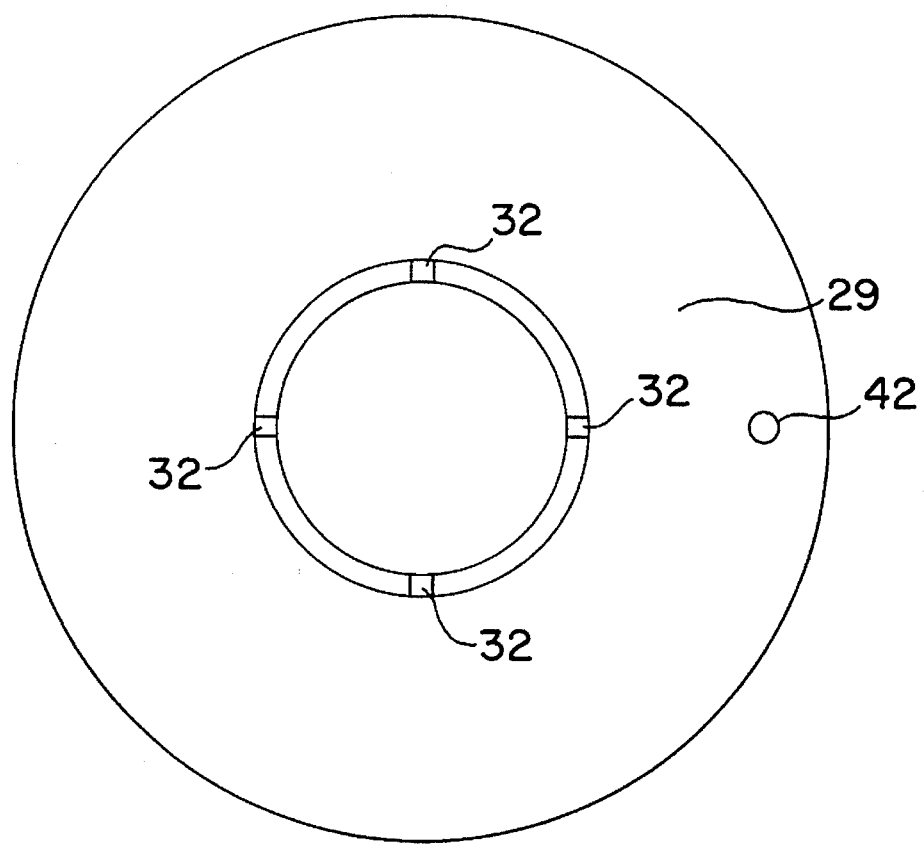

Referring to FIG. 5, the inner conductor piece 40 is shown. This is secured to the side of microwave enclosure 4 by screws in holes 42. The thickness of the inner cylinder is represented by the distance between line 23 and the parallel solid line outside such dotted line. The positioning of the lengthwise slits 32 are clearly shown in the plan view of FIG. 6.

Figure 7:
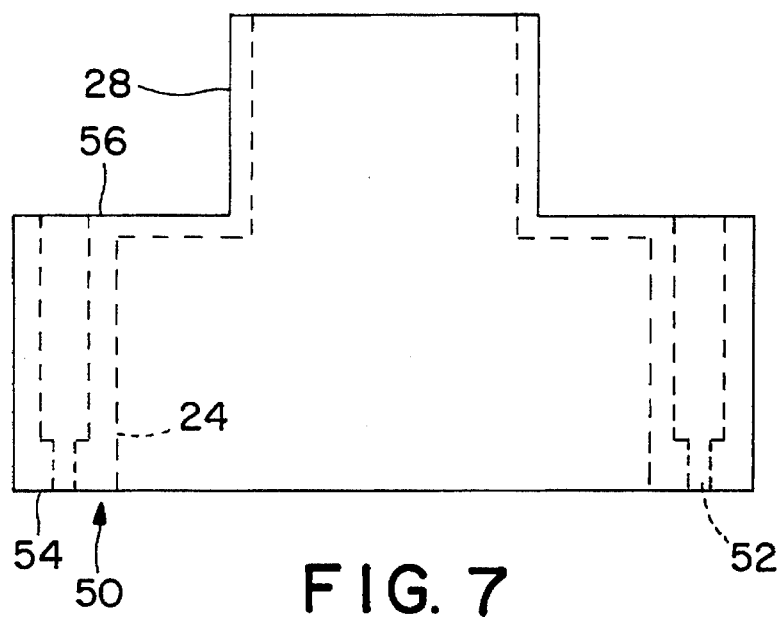
FIGS. 7 and 8 show the part that forms the outer conductor of the coaxial device shown in FIG. 3.
Figure 8:
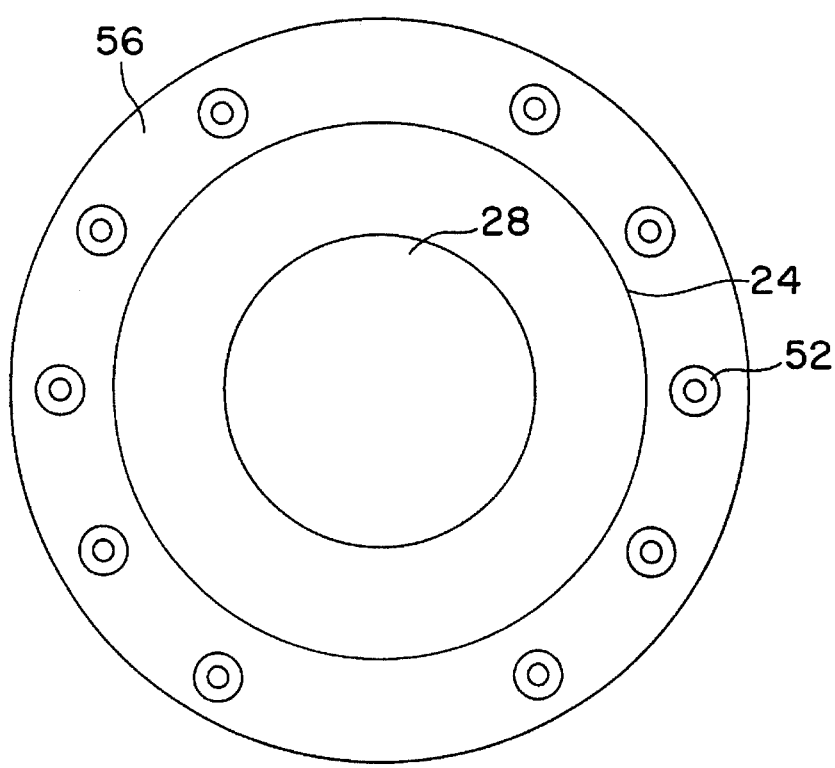

FIGS. 7 and 8 show the outer conductor piece 50 of the coaxial structure. The thickness of the coaxial cylinder is the distance between the inner dotted line and the parallel solid line which is exterior to the dotted line.

Piece 50 is secured to piece 40 by placing surface 54 of piece 50 flush with part 29 of piece 40, and inserting screws in holes 52 of piece 50 and holes 42 of piece 40.

It is noted that the diameters of the inner and outer conductors across the gap are about the same.

For a microwave frequency of 2450 Mhz, the dimensions of the preferred embodiment are:

| | |
|---|---|
| Length of outer conductor (total) | = 2.35" |
| Length of Portion 26 of outer conductor | = 1.25" |
| Length of portion 28 of outer conductor | = 1.0" |
| Diameter of inner conductor (ID) | = 1.3" |
| Diameter of outer conductor (ID) | = 2.70" |
| Length of gap 30 | = .375" |

The microwave trap described above is found to solve the problems which are caused by microwave leakage in the plasma afterglow asher.

Thus, the presence of energetic ions near the wafer is eliminated, as is the wafer damage which is caused by such ions. Also, the system is much more stable and reliable than when the trap is not present. This allows the system to be operated through a wide range of operating parameters such as pressure, flow rate, gas type, and power level. Thus the system is more flexible and versatile than in the prior art. Finally, the UV radiation in the part of the plasma tube which extends out of the microwave enclosure is minimized thus preventing or lessening damage to the semiconductor wafer.

Figure 9:
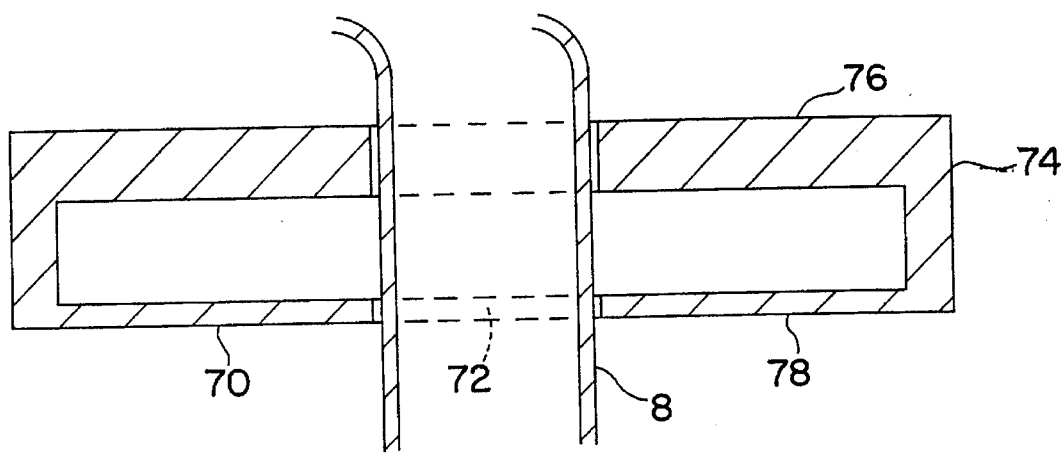
FIG. 9 shows a microwave trap in accordance with a further embodiment of the invention.

FIG. 9 shows a further embodiment of the invention, wherein the microwave trap 70 comprises a cylindrical $TM_{010}$ cavity having an opening 72, through which tube 8 passes. The cavity is comprised of cylindrical member 74, and opposing circular end pieces 76 and 78. When the cavity is dimensioned so as to be in resonance in relation to the microwave frequency, the current flowing in the interior of the cylindrical wall 74 falls to zero at the exit end of the trap, thus indicating that there is no microwave field.

For a microwave frequency of 2450 Mhz, the diameter D of the cylinder is typically 3.7"–4.5" and the length L is typically 0.375"–1.0".

Figure 10:
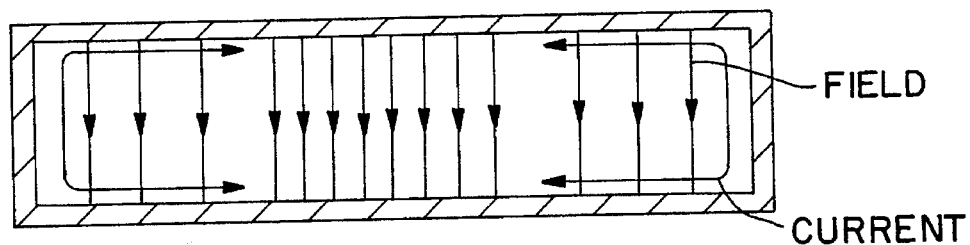
FIGS. 10 and 11 show the field pattern of a $TM_{010}$ cylindrical cavity and an equivalent distributed circuit for the device of FIG. 9.
Figure 11:
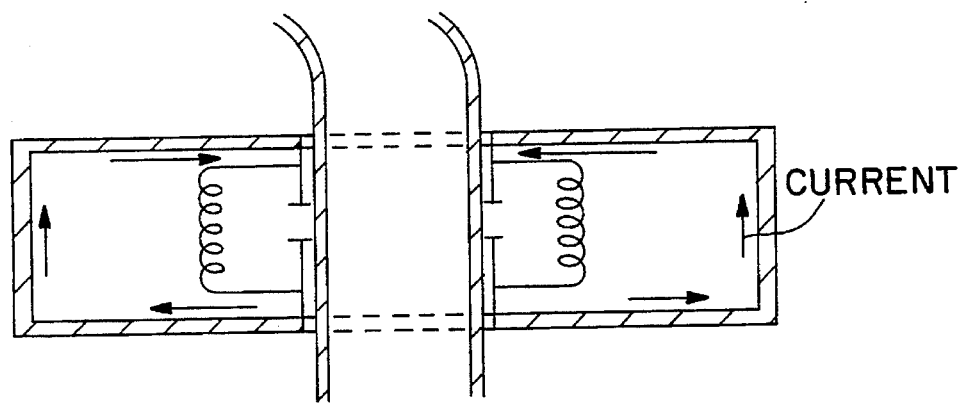

The field pattern of a cylindrical $TM_{010}$ cavity is shown in FIG. 10, while an equivalent distributed circuit for the embodiment of FIG. 9 is depicted in FIG. 11. This equivalent circuit is analogous to a shorted radial transmission line.

While the invention has been described in connection with particular microwave traps, it is noted that other specific designs for such traps may also promote the advantages of the present invention.

Thus, while the invention has been disclosed herein in accordance with an illustrative embodiments, it is noted that variations will certainly occur to those who are skilled in the art, and the scope of the invention is to be understood by reference to the claims which are appended hereto.

We claim:

1. An asher for stripping a photoresist from a substrate, comprising, means for holding said substrate which bears said photoresist, a microwave enclosure, means for providing microwave energy to said microwave enclosure, a plasma tube running through said microwave enclosure and exiting said enclosure through an opening, said tube thereafter extending to a region near said photoresist to be stripped, means for feeding excitable gas through said plasma tube, and a microwave trap located outside said microwave enclosure proximate said opening through which said plasma tube exits for trapping microwave energy which has escaped through said opening, wherein said microwave trap comprises a resonant circuit.

2. The asher of claim 1 wherein said microwave trap comprises a shaped metallic member through which said plasma tube passes, and in which, the microwave current is reduced to zero.

3. The asher of claim 2 wherein said shaped metallic member extends outwardly from said microwave enclosure to an outer end, and wherein the current is reduced to zero at a region between the microwave enclosure and the outer end.

4. The asher of claim 2 wherein said shaped metallic member is a coaxial member.

5. The asher of claim 4 wherein said coaxial member has inner and outer conductors, and wherein the length of the outer conductor is about ¼ wavelength.

6. The asher of claim 4 wherein the coaxial member has an inner conductor, and an outer conductor which is longer than the inner conductor and which extends outwardly from the microwave enclosure for a greater distance than the inner conductor.

7. The asher of claim 6 wherein the diameter of the outer conductor becomes smaller towards the outer end of the member.

8. The asher of claim 7 wherein the diameter of the outer conductor becomes smaller abruptly, so that the outer conductor is comprised of a first portion of relatively larger diameter closer to the microwave enclosure and a second portion of relatively smaller diameter further from the microwave enclosure, and wherein the second portion of the outer conductor is about co-linear with the inner conductor, but is separated therefrom by a gap.

9. The asher of claim 8 wherein said inner and outer conductors are connected by conducting means which is located close to said microwave enclosure.

10. The asher of claim 9 wherein said inner conductor has lengthwise slits.

11. The asher of claim 2 wherein said microwave trap comprises a resonant $TM_{010}$ cavity.

12. An asher for stripping a photoresist from a substrate, comprising, means for holding said substrate which bears said photoresist, a microwave enclosure means for providing microwave energy to said microwave enclosure, a plasma tube running through said microwave enclosure and exiting said enclosure through an opening, said tube thereafter extending to a region near said photoresist to be stripped, means for feeding excitable gas through said plasma tube, and a microwave trap located outside said microwave enclosure proximate said opening through which said plasma tube exits, said trap comprising a metallic member which is coaxial with said plasma tube and through which said plasma tube passes, wherein said metallic member is a resonant circuit in which the microwave current is reduced to zero.

* * * * *